United States Patent
Lai et al.

(10) Patent No.: US 6,284,645 B1
(45) Date of Patent: Sep. 4, 2001

(54) CONTROLLING IMPROVEMENT OF CRITICAL DIMENSION OF DUAL DAMASCEUE PROCESS USING SPIN-ON-GLASS PROCESS

(75) Inventors: Yeong-Chih Lai, Nan-Tou; Yu-Tai Tsai; Chien-Chung Huang, both of Tai-Chung Hsien; Huang-Hui Wu, Chang-Hua Hsien, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/273,291

(22) Filed: Mar. 19, 1999

(51) Int. Cl.$^7$ .............................................. H01L 21/4763

(52) U.S. Cl. .......................... 438/624; 438/631; 438/633; 438/637; 438/638; 438/640

(58) Field of Search .................... 438/624, 631, 438/633, 637, 638, 640

(56) References Cited

U.S. PATENT DOCUMENTS

| | | | |
|---|---|---|---|
| 5,880,018 | * | 3/1999 | Boeck et al. .......................... 438/619 |
| 6,004,883 | * | 12/1999 | Yu et al. .............................. 438/706 |
| 6,204,096 | * | 3/2001 | Lai et al. ............................. 438/624 |

* cited by examiner

*Primary Examiner*—John F. Niebling
*Assistant Examiner*—Lynne A. Gurley
(74) *Attorney, Agent, or Firm*—Powell, Goldstein, Frazer & Murphy LLP

(57) ABSTRACT

The present invention provides a method for controlling the critical dimension of a mask in dual damascene process. The method comprises providing a semiconductor structure which has a contact pattern thereon. A dielectric layer, such as a spin-on glass layer, is formed on the semiconductor structure and the contact pattern. Then a photoresist layer is formed on the dielectric layer. Next, the photoresist layer and the dielectric layer are etched to expose partial the semiconductor structure. Then the exposed semiconductor structure is removed followed by removing the total photoresist layer and the total dielectric layer.

10 Claims, 5 Drawing Sheets

FIG.1BPrior Art)

CONTROLLING IMPROVEMENT OF CRITICAL DIMENSION OF DUAL DAMASCEUE PROCESS USING SPIN-ON-GLASS PROCESS

BACKGROUND OF THE INVENTION

1. Field of the Invention

The present invention relates to the formation of writing structures in integrated circuit devices. More particularly, the present invention relates to the formation of vias, contacts and wiring lines by using a dual damascene process spin-on-glass materials.

2. Description of the Prior Art

Some specific structures, that are semiconductor highly integrated circuits utilize multilevel wiring line structures, usually for interconnecting regions within devices. Also this arrangement is for interconnecting one or more devices within the integrated circuits. Conventionally such an arrangement provides the first or lower level wiring lines or interconnect structures and then form a second level wiring line in contact with the first level wiring lines or interconnect structures.

FIG. 1A shows a semiconductor substrate 100 formed firstly and then silicon oxide layer 101 is deposited onto the substrate 100 using PECVD method. Sequentially, shown in FIG. 1B, silicon nitride layer 102 is then deposited upon the silicon oxide layer 101, by applying PECVD method as well. Next, FIG. 1C a silicon oxide layer 103 is deposited on the silicon nitride 102. Consequentially a pattern of metal lines is transferred and defined on the silicon nitride 102 and the silicon oxide layer 103. Then the silicon nitride 102 and the silicon oxide layer 103 are removed to form a multitude of openings for metal lines, shown as FIG. 1D. Next, depicted in FIG. 1E, a photoresist layer 104 is blanket formed on the silicon oxide layer 101 and the surface and side walls of the silicon oxide layer 103. Another pattern is first transferred onto the photoresist layer 104 and thereafter the silicon oxide layer 101 is partially removed to form a multitude of vias, shown in FIG. 1F. According to the above process, the critical dimension will very thick and therefore it also will seriously effect whole processing.

Commonly, the photoresist layer should be formed thicker for using and owning a long depth of focus in order to expose the entire thickness of the photoresist mask. However, for use of steppers that need high solution, it is difficult in forming quite deep focus in the process. Also it makes thick critical dimension happening and reduces reliability of production.

Interconnections are typically formed between the first level wiring line or interconnect and other portions of the integrated circuit device or to structures external to the integrated circuit device. This will be accomplished through the second level of wiring lines.

SUMMARY OF THE INVENTION

In accordance with the present invention, a method is provided for forming integrated circuit devices that substantially achieves estimated semiconductor devices completely.

In one embodiment, a substrate is first provided and an interlayer dielectric layer is formed over the substrate. Then an etch stop layer is formed and the etch stop layer is patterned. Sequentially a coating layer is formed and a photoresist mask is formed and defined. Consequentially, the photoresist mask and the spin-on-glass layer are all removed. Then a metal layer is deposited. Finally both the following processes for removing excess metal and planarizing the surface of integrated circuit device are carried out.

Apparently the photoresist layer should be formed thicker for using and owning a long depth of focus in order to expose the entire thickness of the photoresist mask according to the present invention. As applied to steppers that do not need high solution, it is much easier in forming a very deep focus in the process. Also this makes thin critical dimension happen and increases reliability of production.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 1A to 1F are sectional views of a semiconductor device formed according to a conventional method;

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed. An alternate, asymmetric embodiment will then be described along with the variations in the process flow to fabricate this embodiment.

The method of the present invention is applied to a broad range of integrated circuits of semiconductors and can be fabricated from a variety of semiconductor devices. The following description discusses several presently preferred embodiments of the device of the present invention as implemented in different sorts of semiconductor, since the majority of currently available semiconductors are fabricated and the most commonly encountered applications of the present invention will involve a dual damascene process. Nevertheless, the present invention may also be advantageously employed in other advanced technologies, and other semiconductor materials. Accordingly, application of the present invention is not intended to be limited to those devices fabricated in silicon semiconductor materials, but will include those devices fabricated in one or more of the available semiconductor materials.

Moreover, while the present invention is illustrated by a number of preferred embodiments directed to form semiconductor devices, it is not intended that these illustrations be a limitation on the scope or applicability of the present invention. Further, while the illustrative examples use insulated integrated circuits, it should be recognized that the insulated gate portions might be replaced with other related apparatus. Thus, it is not intended that the semiconductor devices of the present invention be limited to the structures illustrated. These devices are included to demonstrate the utility and application of the present invention to presently preferred embodiments.

One of the preferred embodiments of the present invention is shown in FIGS. 2A to 2I. In this embodiment, a semiconductor structure is made by dual damascene process. The processing of flow-chart is described in detail below, while the processing of the semiconductor structure will be readily apparent to those skilled in the art from the detailed description.

Figure 1A:
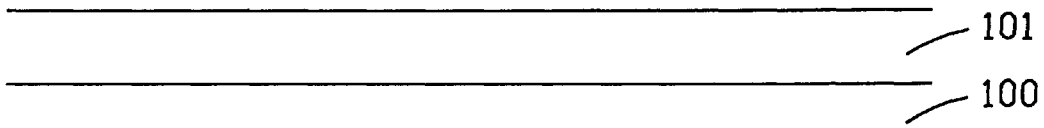
Figure 1C:
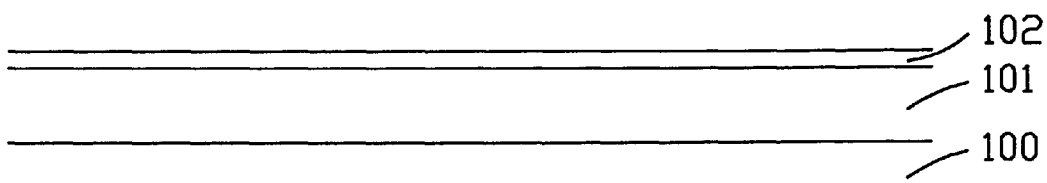
Figure 1C:
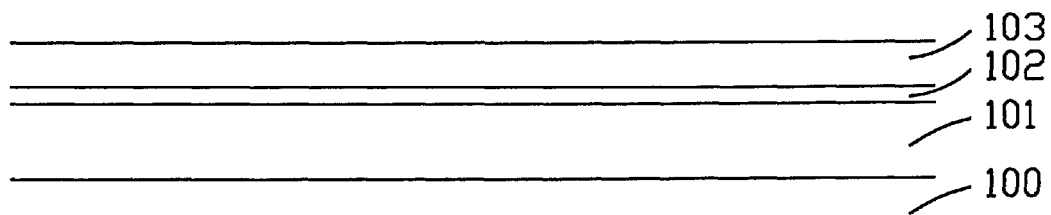
Figure 1D:
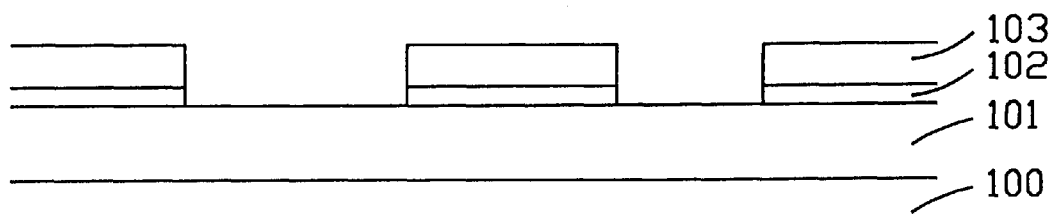
Figure 1E:
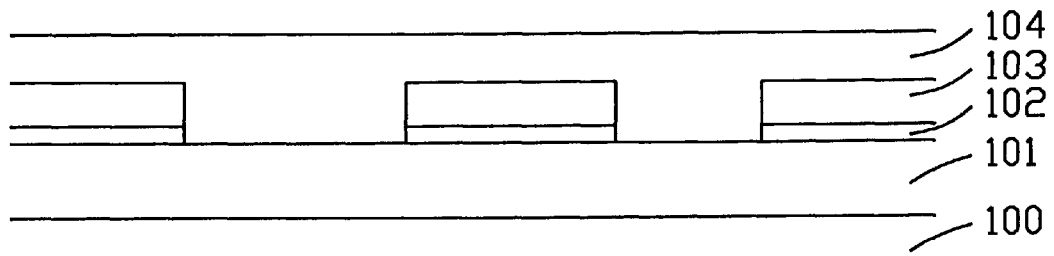
Figure 1F:
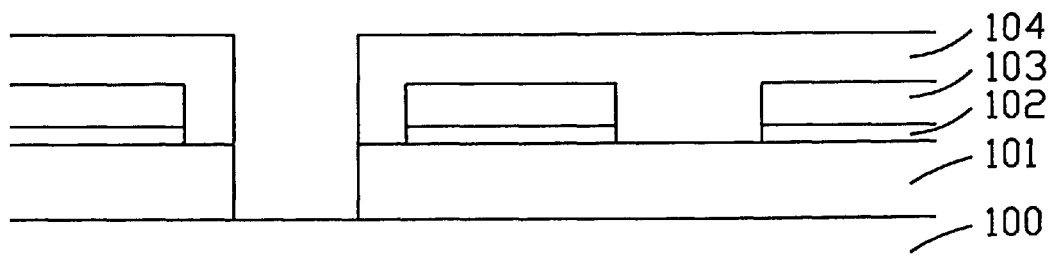
Figure 2A:
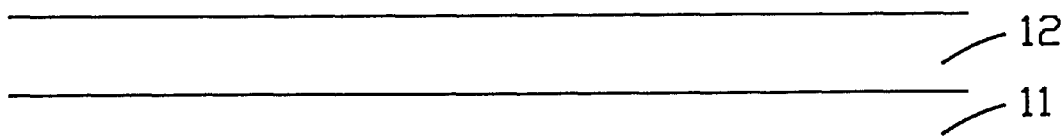
FIGS. 2A to 2J are sectional views showing in combination an embodiment of the present invention.
Figure 2B:
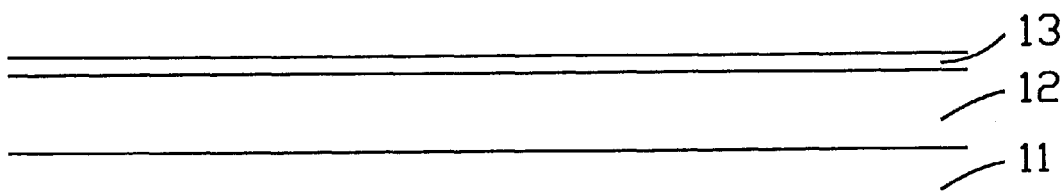
Figure 2C:
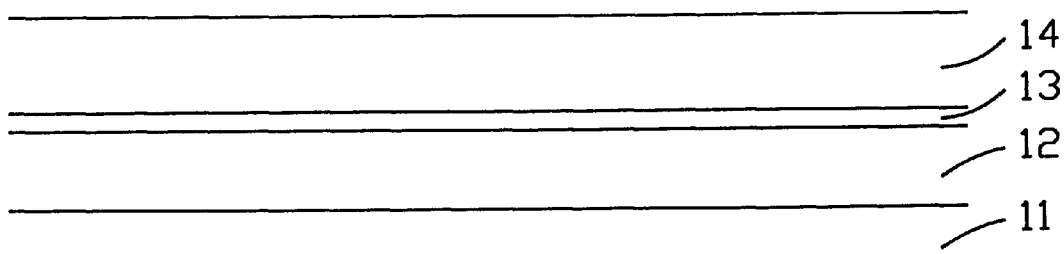
Figure 2D:
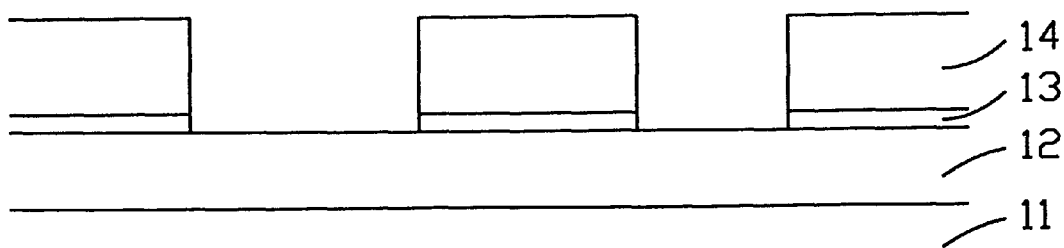

FIG. 2A show a silicone oxide layer 12 is deposited on a substrate 11 by PECVD method. Next, depicted in FIG. 2B a silicon nitride layer 13 as an etch stop layer is deposited upon the silicon oxide layer 12 applying by PECVD method as well. Next, shown in FIG. 2C a silicon oxide layer 14 is formed onto the silicon nitride layer 13 by using PECVD method. Consequentially a pattern is defined and transferred into the silicon oxide layer 14 and the silicon nitride layer 13. There are some openings for forming contacts formed by removing the partial silicon oxide layer 14 and the silicon nitride layer 13, shown in FIG. 2D.

Figure 2E:
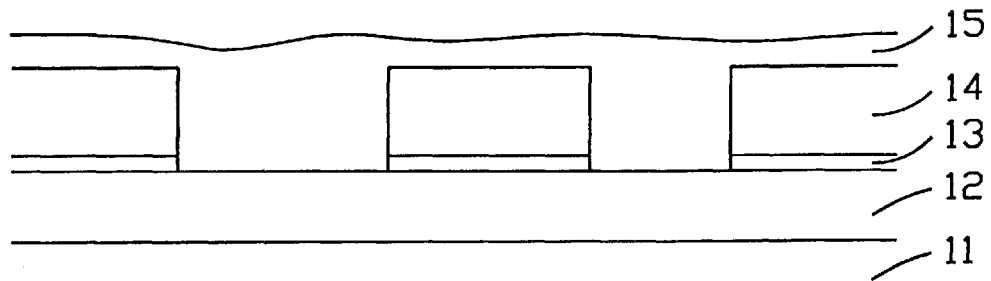
Figure 2F:
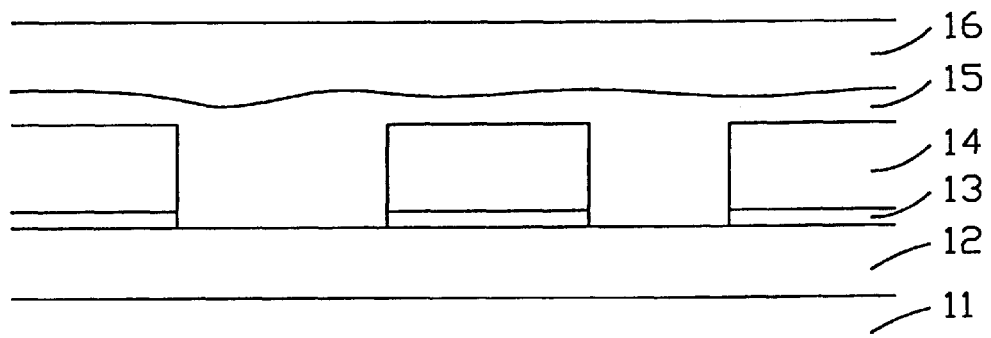
Figure 2G:
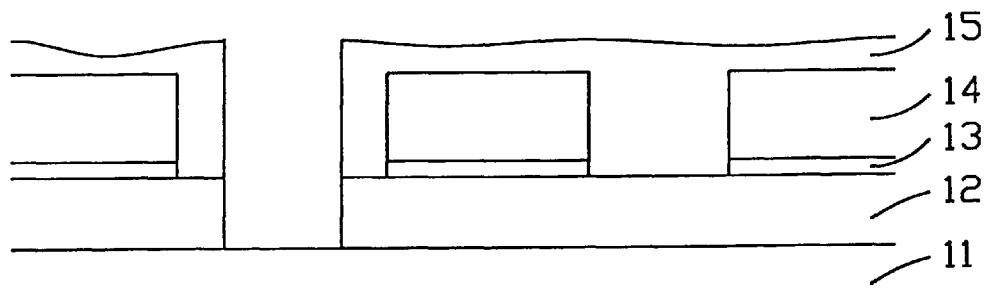

Next, as a key step of the present invention is shown in FIG. 2E. A dielectric layer, such as spin-on-glass layer 15, is blanket formed over the surface and side walls of the silicon oxide layer 14, the silicon nitride layer 13, and the exposed surface of silicon oxide layer 12. Then a photoresist layer 16 is formed on the spin-on-glass layer 15, shown in FIG. 2F. The purpose of the spin-on-glass layer 15 is to provide better planar surface and filling capacity. Because of better planar surface and filling capacity of the spin-on-glass layer 15, the thickness of the photoresist layer 16 can be reduced. Compared with a single photoresist layer as a mask, the combination of the spin-on-glass layer 15 and the photoresist layer 16 can provide a mask with a thinner thickness, that can reduce the critical dimension of the mask for the stepper during pattern transference.

Next, a pattern of via and contacts is transferred into the photoresist layer 16 and the spin-on-glass layer 15. The photoresist layer 16 and the spin-on-glass layer 15 are first etched to expose the partial silicon oxide layer 12, then the exposed silicon oxide layer 12 is removed for forming the vias and contacts. Next, the whole photoresist layer 16 is removed by suitable methods, shown in FIG. 2G.

Figure 2H:
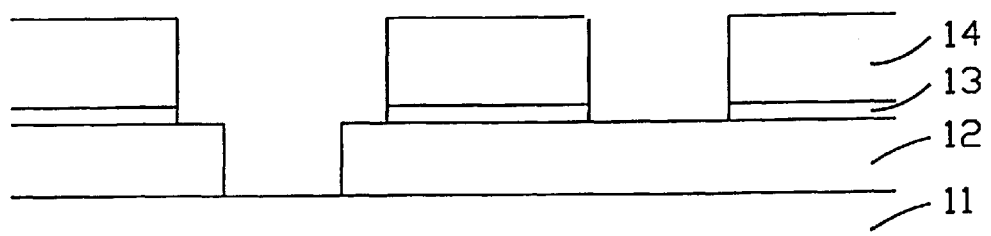

Next, shown in FIG. 2H, the whole spin-on-glass layer 15 is removed by using diluted KOH solution or a buffered HF solution with ratio of one-tenth. Because etch selectivity of SOG. to silicon oxide is about 40/1 provided by the etch solution, the spin-on-glass layer 15 can be clearly removed and cause no damage on the silicon oxide layer 12.

Figure 2I:
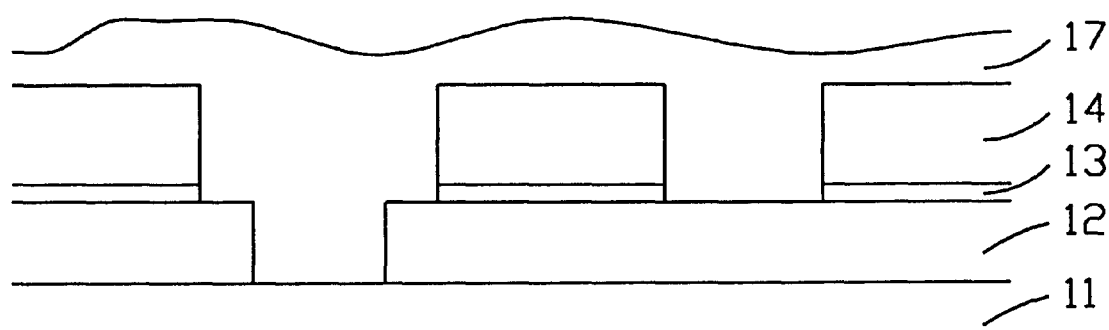
Figure 2J:
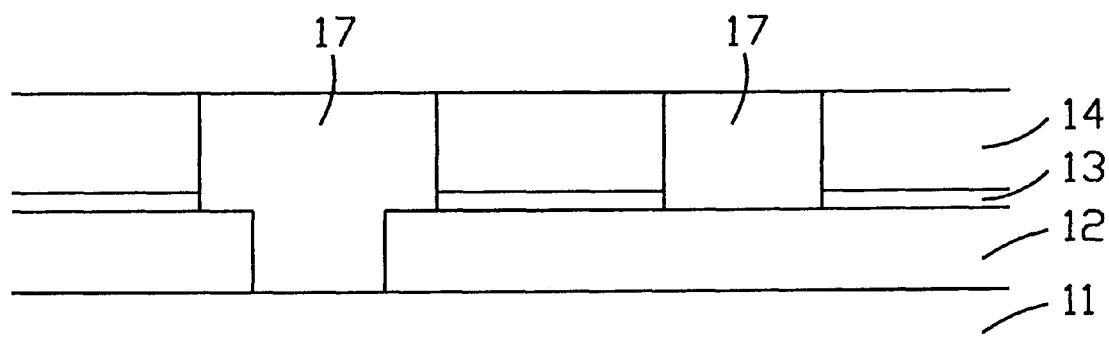

Next, a conductive layer 17 is filled into the vias, contacts, and over the surface of the silicon oxide layer 14, shown in FIG. 2I. Finally, planarity of the conductive layer 17 is accomplished by the chemical mechanical polishing, shown in FIG. 2J.

One of objectives of the present invention is to provide a method for controlling the critical dimension of a mask in dual damascene process. The method comprises providing a semiconductor structure which has a substrate and a first dielectric layer thereon. A second dielectric layer is formed on the first dielectric layer, which has a contact pattern to expose partial the first dielectric layer. A third dielectric layer is formed on the second dielectric layer, which has the contact pattern to expose partial the first dielectric layer. Next, a glass layer is spun on the exposed first dielectric layer, the first side walls of the second dielectric layer, and the second side walls and surface of the third dielectric layer. Then a photoresist layer is formed on the glass layer. Next, the photoresist layer and the glass layer are etched to expose partial the first dielectric layer. The exposed first dielectric layer is then removed to expose partial the substrate. The photoresist layer and the glass layer are removed to expose patterned the first side walls of the second dielectric layer and the second side walls and the surface of the third dielectric layer.

While the present invention has been described with particular reference to preferred embodiments thereof, it is to be understood that these embodiments are provided by way of example. Those of ordinary skill will readily appreciate that variations and modifications can be made from these embodiments without varying from the basic teachings of the present invention. Accordingly, the scope of the present invention is not to be limited to the described preferred embodiments, but instead the scope of the present invention is to be determined by the claims, which follow.

Although specific embodiments have been illustrated and described, it will be obvious to those skilled in the art that various modifications may be made without departing from what is intended to be limited solely by the appended claims.

What is claimed is:

1. A method of controlling the critical dimension of a mask in dual damascene process, the method of comprising:

providing a semiconductor structure, said semiconductor structure having a contact pattern thereon;

forming a dielectric layer on said semiconductor structure and said contact pattern;

forming a photoresist layer on said dielectric layer;

etching said photoresist layer and said dielectric layer to expose partial said semiconductor structure;

removing said exposed semiconductor structure;

removing total said photoresist layer; and removing total said dielectric layer.

2. The method according to claim 1, wherein said semiconductor structure comprises:

providing a substrates;

a first silicon oxide layer on said substrate;

a silicon nitride layer on said first silicon oxide, said silicon nitride layer having said contact pattern; and a second silicon oxide layer on said silicon nitride layer, said second silicon oxide layer having said contact pattern.

3. The method according to claim 2, wherein said removing said exposed semiconductor structure is to etch exposed said first silicon oxide layer.

4. The method according to claim 1, wherein said dielectric layer comprises a spin-on glass layer.

5. The method according to claim 1, wherein said removing total said dielectric layer is accomplished by a dilute potassium hydroxide.

6. A method for controlling the critical dimension of a mask in dual damascene process, the method comprising:

providing a semiconductor structure, said semiconductor having a substrate and first dielectric layer thereon;

forming a second dielectric layer on said first dielectric layer, said second dielectric layer having a contact pattern to expose partial said first dielectric layer;

forming a third dielectric layer on said second dielectric layer, said third dielectric layer having said contact pattern to expose partial said first dielectric layer;

spinning-on a glass layer on said exposed first dielectric layer, a plurality of first side walls of said second dielectric layer, and a plurality of second side walls and surface of said third dielectric layer;

forming a photoresist layer on said glass layer;

etching said photoresist layer and said glass layer to expose partial said first dielectric layer;

removing exposed said first dielectric layer to expose partial said substrate;

removing said photoresist layer; and removing said glass layer to expose patterned said first side walls of said second dielectric layer and said second side walls and said surface of said third dielectric layer.

7. The method according to claim 6, wherein said first dielectric layer comprises a silicon oxide layer.

8. The method according to claim 6, wherein said second dielectric layer comprises a silicon nitride layer.

9. The method according to claim 6, wherein said third dielectric layer comprises a silicon oxide layer.

10. The method according to claim 6, wherein said removing said glass layer is accomplished by a dilute potassium hydroxide solution.

* * * * *